US008878604B2

(12) United States Patent
Ohira et al.

(10) Patent No.: US 8,878,604 B2
(45) Date of Patent: Nov. 4, 2014

(54) SWITCHING CIRCUIT AND ENVELOPE SIGNAL AMPLIFIER

(75) Inventors: Takashi Ohira, Toyohashi (JP);
Kazuyuki Wada, Toyohashi (JP);
Mitsutoshi Nakata, Toyohashi (JP);
Kazushi Sawada, Toyohashi (JP);
Satoshi Hatsukawa, Osaka (JP); Nobuo Shiga, Osaka (JP); Kazuhiro Fujikawa, Osaka (JP)

(73) Assignees: Sumitomo Electric Industries, Ltd., Osaka-shi (JP); National University Corporation Toyohashi University of Technology, Toyohashi-shi (JP)

( * ) Notice: Subject to any disclaimer, the term of this patent is extended or adjusted under 35 U.S.C. 154(b) by 62 days.

(21) Appl. No.: 13/643,978

(22) PCT Filed: Mar. 28, 2011

(86) PCT No.: PCT/JP2011/057648
§ 371 (c)(1),
(2), (4) Date: Oct. 26, 2012

(87) PCT Pub. No.: WO2011/148710
PCT Pub. Date: Dec. 1, 2011

(65) Prior Publication Data
US 2013/0049862 A1    Feb. 28, 2013

(30) Foreign Application Priority Data
May 25, 2010 (JP) .................................. 2010-119483

(51) Int. Cl.
H03F 3/38    (2006.01)

(52) U.S. Cl.
USPC .......................................... 330/10; 330/136

(58) Field of Classification Search
USPC ....... 330/10, 51, 53, 84, 98, 133, 150, 207 A, 330/251, 286, 310, 136
See application file for complete search history.

(56) References Cited

U.S. PATENT DOCUMENTS 4,164,714 A      8/1979   Swanson
4,486,719 A  *  12/1984   Ayasli .......................... 330/286
(Continued)

FOREIGN PATENT DOCUMENTS

JP    53-42347 A    4/1978
JP    54-57941 A    5/1979
(Continued)

OTHER PUBLICATIONS

Extended European Search Report in European Patent Application No. 11786410.8, dated Nov. 22, 2013.
(Continued)

Primary Examiner — Khanh V Nguyen
(74) Attorney, Agent, or Firm — Venable LLP; Steven J. Schwarz; George L. Howarah

(57) ABSTRACT

A switching circuit according to one embodiment has: N switching elements; a connection circuit including N−1 first inductance elements that are connected in series; a second inductance element; and N third inductance elements. Control terminals of the N switching elements are connected to ends of the connection circuit and connection contacts, respectively. One end of the second inductance element is connected to a power supply. The N third inductance elements electrically connects one ends of the N switching elements and the other end of the second inductance element with each other, respectively.

5 Claims, 7 Drawing Sheets

(56) References Cited

U.S. PATENT DOCUMENTS

| | | |
|---|---|---|
| 6,281,666 B1 | 8/2001 | Tressler et al. |
| 6,838,931 B2 * | 1/2005 | Midya et al. .................. 330/10 |
| 7,271,657 B2 * | 9/2007 | Friedrich et al. ............. 330/286 |
| 7,394,233 B1 | 7/2008 | Trayling et al. |
| 7,679,434 B2 * | 3/2010 | Reynaert et al. ............... 330/10 |
| 2007/0008034 A1 | 1/2007 | Tayrani |

FOREIGN PATENT DOCUMENTS

| | | |
|---|---|---|
| JP | 06-273191 | 9/1994 |
| JP | 08-340240 A | 12/1996 |
| JP | 09-064610 | 3/1997 |
| JP | 2000-173794 A | 6/2000 |
| JP | 2002-033627 | 1/2002 |
| JP | 2005-168106 A | 6/2005 |
| JP | 2007-215158 | 8/2007 |
| JP | 2008-545336 | 12/2008 |
| JP | 2009-060466 | 3/2009 |
| WO | WO-2004/047288 A1 | 6/2004 |

OTHER PUBLICATIONS

International Search Report and Written Opinion dated Dec. 20, 2012, issued in International Application No. PCT/JP2011/057648 (Forms PCT/IB/338; PCT/IB/373; and PCT/ISA/237).

Notice of Reasons for Rejection in Japanese Patent Application No. 2010-119483, dated Dec. 17, 2013.

* cited by examiner

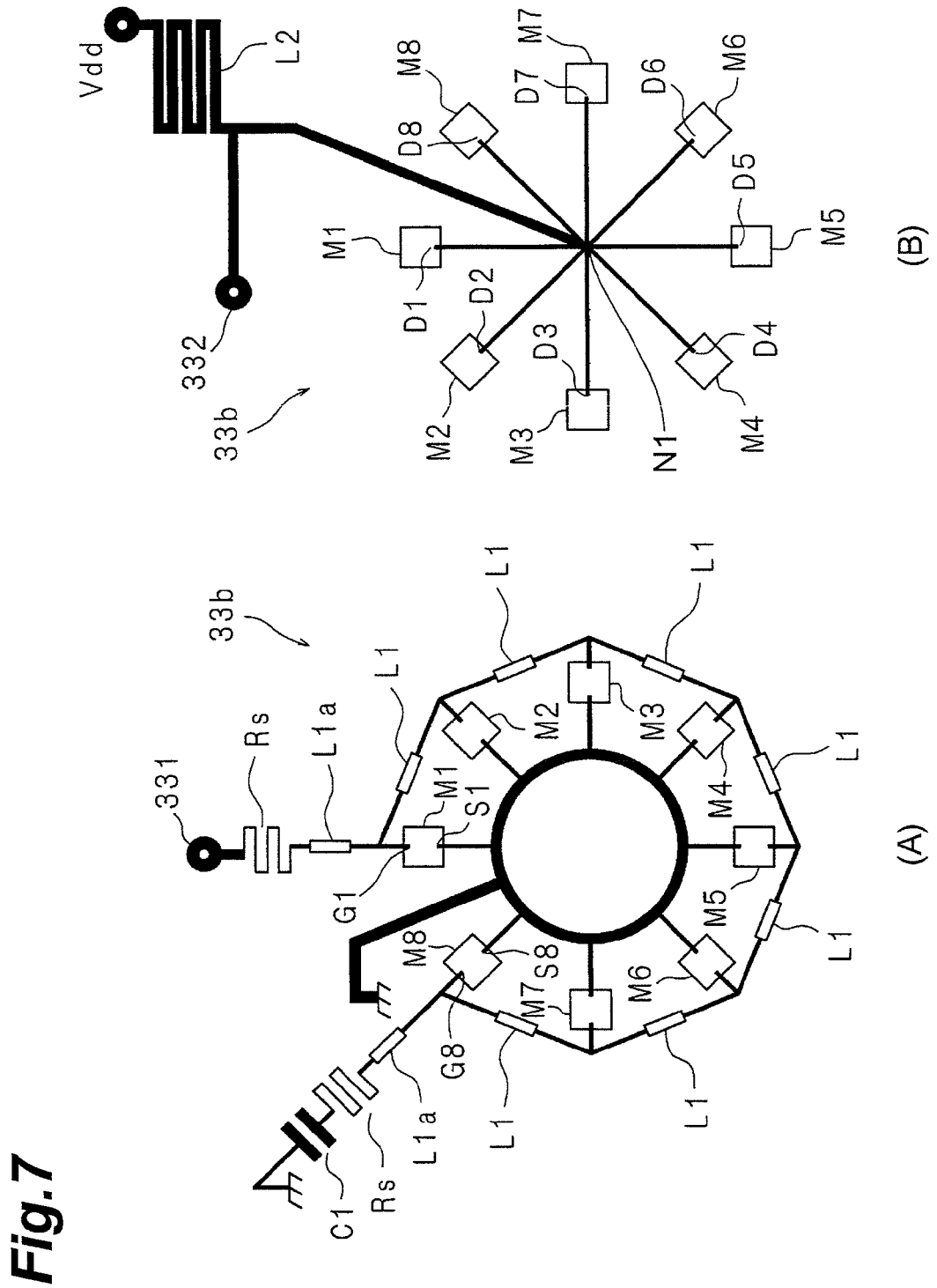

SWITCHING CIRCUIT AND ENVELOPE SIGNAL AMPLIFIER

TECHNICAL FIELD

The present invention relates to a switching circuit for switching a switching element, which is connected to an inductance element, with a PWM (Pulse Width Modulation) signal. The present invention also relates to an envelope signal amplifier including the switching circuit.

BACKGROUND ART

In recent years, an EER (Envelope Elimination and Restoration) system has been used as one of the amplification systems used for power-amplifying a high-frequency modulation signal in a base station of a cellular phone, etc. The EER system amplifies a signal by extracting an amplitude component (envelope) and phase component from a modulation signal to be amplified, and modulating the amplitude of a signal corresponding to the phase component with a signal corresponding to the amplitude component, so that the amplitude of the modulated signal becomes proportional to the amplitude of the original modulation signal.

More specifically, voltage that follows the extracted envelope is applied to a saturated amplifier as a power supply voltage. This amplifier causes the amplitude of the amplified signal to follow the extracted envelope, by amplifying the signal corresponding to the phase component. The voltage that follows the envelope is obtained by, for example, power-amplifying a detected signal (referred to as "envelope signal" hereinafter) obtained through envelope detection performed on the modulation signal to be amplified. The saturated amplifier is used to power-amplify the envelope signal in order to achieve high efficiency. For example, the envelope signal is demodulated as a modulation signal, by switching elements with a PWM signal, which is generated by performing pulse width modulation on the envelope signal, and integrating the PWM signal amplified as a result of switching.

In most cases, a class D amplifier having complementary switching elements push-pull connected to each other, or a class E amplifier for turning on a switching element when voltage applied from an inductance element is zero, is used in order to amplify a PWM signal. However, it is technically difficult for the class D amplifier to enhance the withstand voltages of the complementary switching elements in a balanced manner. In the class E amplifier, surge voltage that is applied from the inductance element to the switching element when the switching element is turned off may exceed power supply voltage significantly under some design and operating conditions. For these reasons, there are, inevitably, limits in applying the push-pull switching elements or the single switching element to a high-frequency and high-power amplifier.

Additionally, the abovementioned PWM signal contains an envelope signal component of relatively low frequency and a PWM signal component of high frequency. A PWM signal amplifier is therefore required to have wideband frequency characteristics. As such an amplifier that meets the requirement, it is conceivable that the distributed amplifier disclosed in Patent Literature 1, for example, is applied to a PWM signal amplifier.

Citation List

Patent Literature

Patent Literature 1: Japanese Patent Application Publication No. 2002-033627

SUMMARY OF INVENTION

Technical Problem

However, one of the problems of the distributed amplifier is that power that propagates to the side opposite to an output terminal needs to be consumed and terminated at a resistor in a distributed constant line that combines power output by means of a plurality of switching elements, which causes a great loss at a termination resistor. Moreover, a low-pass filter is necessary for extracting from the amplified PWM signal an envelope signal as a modulation signal. The insertion loss of the low-pass filter is not negligible.

The present invention was contrived in view of the circumstances described above, and an object thereof is to provide a switching circuit capable of synthesizing, with low loss, PWM signals amplified at a plurality of switching elements and demodulating a modulation signal, and an envelope signal amplifier including this switching circuit.

Solution to Problem

A switching circuit according to one aspect of the present invention is a switching circuit, having: a connection circuit that cascade-connects control terminals for controlling switching of N switching elements (N is an integer of 2 or more), via N−1 first inductance elements; a second inductance element, one end of which is connected to a DC power supply; and third inductance elements connected between the other end of the second inductance element and one ends of the switching elements, respectively, wherein the plurality of switching elements are switched sequentially by a PWM signal that is input to an input terminal of the connection circuit. In other words, this switching circuit has: (a) N switching elements; (b) a connection circuit including N−1 first inductance elements; (c) a second inductance element; and (d) N third inductance elements. Each of the N switching elements has one end and a control terminal. The second inductance element has one end and the other end. The N−1 first inductance elements are connected in series. The control terminals of the N switching elements are connected to a plurality of nodes inside the connection circuit, respectively. The plurality of nodes include connection contacts of the N−1 first inductance elements, as well as input and output terminals of the connection circuit. The N third inductance elements electrically connects one ends of the N switching elements and the other end of the second inductance element with each other, respectively.

In this switching circuit, the control terminals of the N switching elements are connected to the connection contacts of the N−1 first inductance elements configuring the connection circuit through which the PWM signal propagates and the input and output terminals of the connection circuit, respectively. Further, the third inductance elements are interposed between one ends of the switching elements and the other end of the second inductance element having one end connected to the DC power supply, respectively.

Due to this configuration, the switching elements are sequentially switched at a constant time interval by the PWM signal propagating through the connection circuit, and PWM signals of substantially equal amplitude that are amplified at the switching elements are added up at the other end of the second inductance element. When this switching circuit receives input of a PWM signal that has a modulation cycle (PWM cycle) equivalent to N times the time interval, signal points corresponding to signal amplitudes and phases of fundamental waves of the PWM signals obtained at the one ends of the switching elements, are arranged on a circle around the origin in a complex plane, at a regular interval with a phase difference of $-2\pi/N$. Therefore, in this switching circuit, the PWM signals that are output to the one ends of the switching elements are added up such that the fundamental waves of the PWM signals cancel each other out at the other end of the second inductance element.

Similarly, when the signal points, which correspond to the signal amplitudes and phases of the PWM signals output to the one ends of the switching elements based on Mth harmonic (M is an integer of 2 or more) of the PWM signal, are arranged on a circle around the origin in the complex plane, at a regular interval with a phase difference of $-2M\pi/N$, the PWM signals are added up such that the harmonics of the PWM signals output to the one ends of the switching elements cancel each other out.

In one embodiment, connecting members that electrically connect the one ends of the switching elements with the other end of the second inductance element may configure the third inductance elements. In the switching circuit of this embodiment, the third inductance elements that are interposed between the one ends of each switching element and the other end of the second inductance element are realized by the connecting members. Accordingly, parasitic inductances of the connecting members function as the third inductance elements.

In the switching circuit of one embodiment, N may be an integer of 8 or more. In the switching circuit of this embodiment, when the signal amplitudes and phases of the Mth harmonics of the PWM signals obtained at the one ends of the switching elements are associated with the signal points on the complex plane, the phase difference between the signal points ($-2M\pi/N$) becomes M times the phase difference ($-2\pi/N$) between the signal points corresponding to the fundamental waves. In other words, the signal points first overlap at one point when the harmonics are Nth harmonics (M=N). Thus, when N is equal to or greater than 8, for at least the second-order harmonic to the seventh-order harmonic, the signal points on the complex plane which correspond to the one ends of the switching elements do not overlap at one point, and the harmonics cancel each other out.

In one embodiment, the switching elements and the first, second, and third inductance elements may be formed on a semiconductor substrate of a monolithic integrated circuit. Forming the switching circuit of this embodiment on a semiconductor substrate of a monolithic integrated circuit can reduce the size of the switching circuit, improving the harmonic performance of the switching circuit functioning as an amplifier.

In one embodiment, each of the switching elements may be a vertical MOSFET. In this embodiment, making each of the switching elements a vertical MOSFET can not only improve the withstand voltage and power of the switching circuit but also reduce an on-resistance thereof and hence loss.

Furthermore, when the vertical MOSFET is applied as each of the switching elements of the monolithic integrated circuit, a drain electrode of each switching element and source and gate electrodes of the same are separated into two surfaces of the monolithic integrated circuit. As a result, for instance, the lengths of wirings extending from the drain electrodes of the switching elements to the other end of the second inductance element can be made equal to one another, and the PWM signals amplified at the switching elements can be added up in a balanced manner at the other end of the second inductance element.

An envelope signal amplifier according to another aspect of the present invention has a modulation circuit for performing pulse width modulation on an analog signal, and the switching circuit according to the abovementioned aspect or any of the embodiments described above, wherein the switching circuit is switched by a PWM signal that is obtained as a result of pulse width modulation performed by the modulation circuit on an envelope signal of a modulation signal.

In this envelope signal amplifier, the modulation circuit performs pulse width modulation on an envelope signal of an input modulation signal, and switches the switching circuit by means of a PWM signal obtained as a result of the pulse width modulation, to demodulate the envelope signal. As a result, the PWM signals amplified at the plurality of switching elements can be synthesized with low loss, and the switching circuit capable of demodulating the modulation signal can be applied to the envelope signal amplifier.

Advantageous Effects of Invention

According to the switching circuit described above, the switching elements are sequentially switched at a constant time interval by the PWM signal propagating through the connection circuit, and the PWM signals of substantially equal amplitude that are amplified at the switching elements are added up at the other end of the second inductance element.

When the abovementioned switching circuit receives input of a PWM signal that has a modulation cycle equivalent to N times the abovementioned time interval, signal points corresponding to the amplitudes and phases of the PWM signals output to the one ends of the switching elements based on the fundamental waves of the PWM signal are arranged on a circle around the origin in a complex plane, at a regular interval with a phase difference of $-2\pi/N$. Therefore, the PWM signals that are output to the one ends of the switching elements are added up such that the fundamental waves thereof cancel each other out. Similarly, when the signal points, which correspond to the amplitudes and phases of the PWM signals output to the one ends of the switching elements based on Mth harmonic (M is an integer of 2 or more) of the PWM signal, are arranged on a circle around the origin in the complex plane, at a regular interval with a phase difference of $-2M\pi/N$, the PWM signals that are output to the one ends of the switching elements are added up such that the harmonics thereof cancel each other out.

Therefore, the PWM signals amplified at the plurality of switching elements can be synthesized with low loss to modulate the modulation signal.

BRIEF DESCRIPTION OF DRAWINGS

FIG. 7 is a schematic plan view of a switching circuit according to yet another embodiment.

DESCRIPTION OF EMBODIMENTS

Hereinafter is described in detail an embodiment (Embodiment 1) in which an envelope signal amplifier with a switching circuit according to one embodiment is applied to an EER-type amplifier (referred to as "EER amplifier" hereinafter) used in a base station of a cellular phone.

Figure 1:
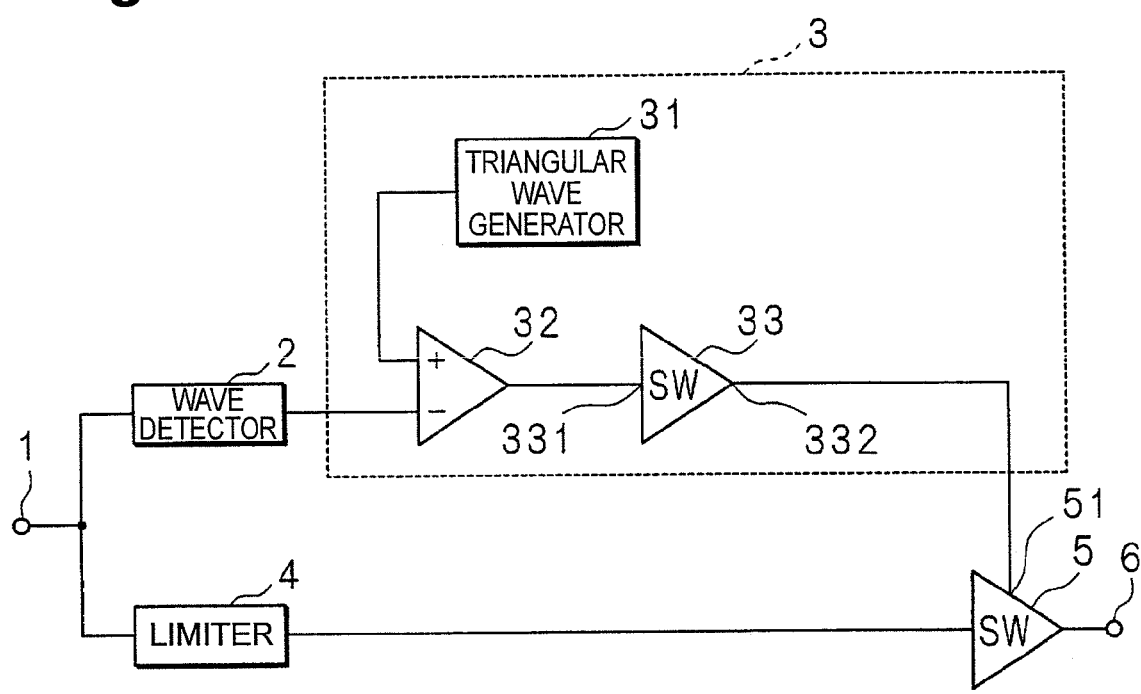
FIG. 1 is a block diagram showing configurations of substantial parts of an EER amplifier according to one embodiment.

FIG. 1 is a block diagram showing configurations of substantial parts of the EER amplifier according to the embodiment. The EER amplifier has a wave detector 2 for performing envelope detection on a modulation signal of a cellular phone that is input from an input terminal 1, an envelope signal amplifier 3 that amplifies a detected signal (envelope signal), a limiter 4 for limiting the amplitude of the input modulation signal to extract a phase component thereof, and a switching circuit 5 for amplifying the extracted phase component.

The envelope signal amplifier 3 has a triangular wave generator 31 for generating a triangular wave of a constant frequency, and a comparator 32 for comparing the triangular wave generated by the triangular wave generator 31 with a detected signal generated by the wave detector 2 and thereby transmitting to a switching circuit 33 a PWM signal, a pulse width of which is modulated in accordance with the detected signal generated by the wave detector 2. A modulation frequency component for pulse width modulation and a harmonic component are removed from the PWM signal that is switched by the switching circuit 33 and has the amplitude thereof increased. Consequently, the envelope signal is demodulated by the switching circuit 33. This envelope signal is transmitted to the switching circuit 5. The switching circuit 5 uses the envelope signal obtained from the switching circuit 33 of the envelope signal amplifier 3 as power supply voltage, and switches a switching element, not shown, based on the phase component obtained from the limiter 4, to cause the amplified amplitude of the phase component to follow the envelope signal.

Figure 2:
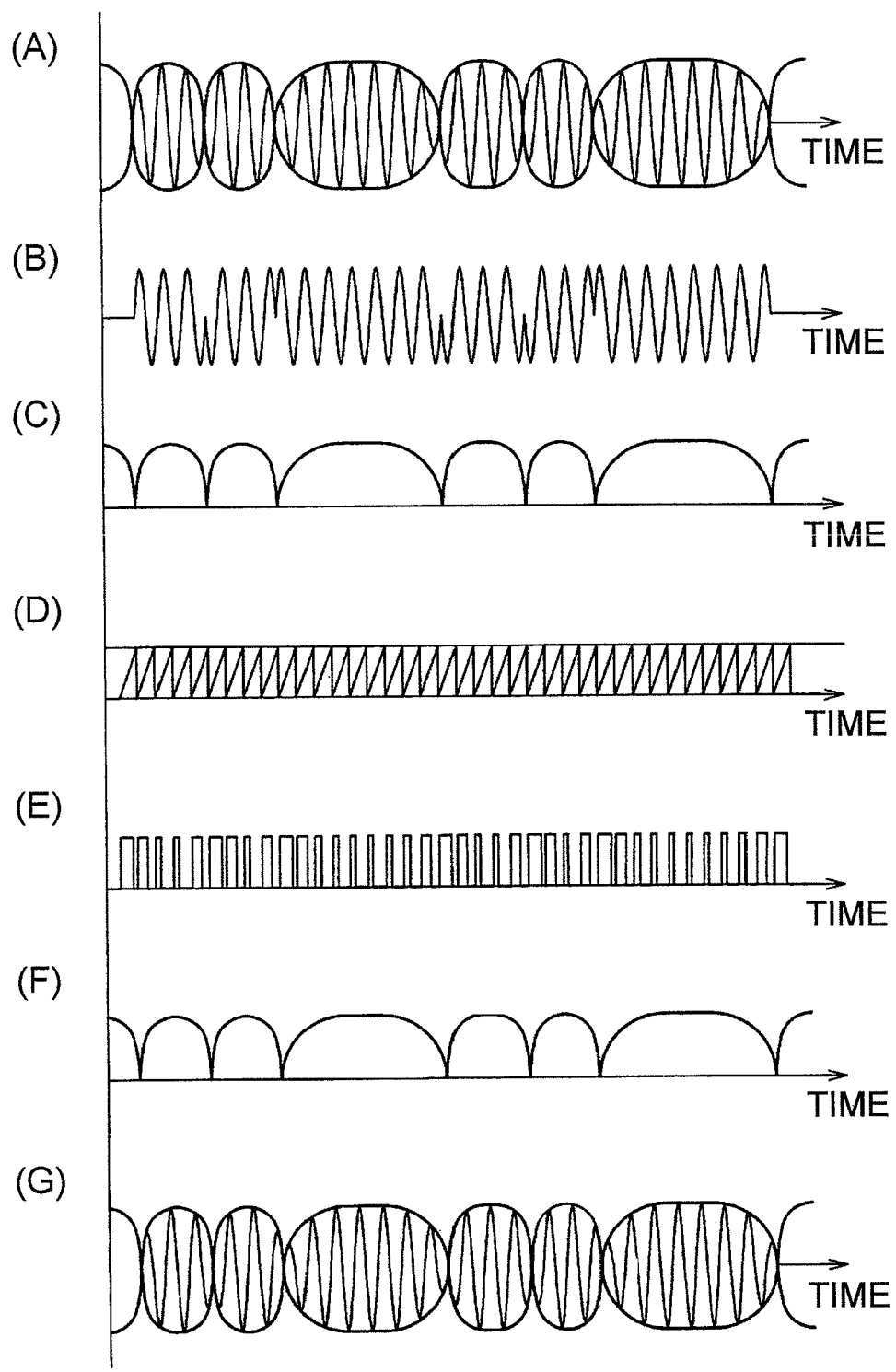
FIG. 2 is an explanatory diagram, schematically illustrating a signal waveform of each part of the EER amplifier.

FIG. 2 is an explanatory diagram, schematically illustrating a signal waveform of each part of the EER amplifier. In each of (A) to (G) of FIG. 2, the horizontal axis represents time and the vertical axis represents the amplitude of the signal of each part. Note that the scales of the vertical axes vary.

A waveform of a modulation signal transmitted to the input terminal 1 is shown in (A) of FIG. 2. The input modulation signal is a signal generated by applying phase modulation and amplitude modulation to a carrier wave. A waveform of the phase component that is extracted from the input modulation signal by the limiter 4 is shown in (B) of FIG. 2. A waveform of the detected signal (envelope signal) generated as a result of envelope detection performed on the input modulation signal by the wave detector 2 is shown in (C) of FIG. 2. The amplitude of the phase signal shown in (B) of FIG. 2 is constant. In the envelope signal shown in (C) of FIG. 2, components of the carrier wave of the modulation signal are removed.

A waveform of the triangular wave input to the comparator 32 is shown in (D) of FIG. 2. A waveform of the output signal (PWM signal) of the comparator 32 is shown in (E) of FIG. 2.

The comparator 32 compares the envelope signal shown in (C) of FIG. 2 with the triangular wave to output the PWM signal, the pulse width of which is modulated in accordance with the envelope signal. When the crest value of the envelope signal is low (or high), the pulse width of the PWM signal is wide (or narrow). A waveform of an output signal of the switching circuit 33 is shown in (F) of FIG. 2. The switching circuit 33 removes, from the PWM signal, the modulation frequency component of pulse width modulation and the frequency component higher than the modulation frequency component, by amplifying the PWM signal of the comparator 32 through polarity inversion. In other words, the signal shown in (F) of FIG. 2 is obtained by amplifying the envelope signal shown in (C) of FIG. 2.

A waveform of an output signal of the switching circuit 5 is shown in (G) of FIG. 2. The switching circuit 5 generates the output signal by amplifying the phase component shown in (B) of FIG. 2 by using the envelope signal itself shown in (F) of FIG. 2 as the power supply voltage. In this case, the amplitude of the signal output by the switching circuit 5 follows the power supply voltage. Therefore, the phase signal that has the amplitude following the envelope signal is output from the switching circuit 5. In this manner, the amplitude component is amplified, while keeping the phase component of the modulation signal shown in (A) of FIG. 2, and the signal shown in (G) of FIG. 2 is output from the EER amplifier.

It should be noted that, in Embodiment 1, the modulation frequency for pulse width modulation, which is the frequency of the triangular wave generated by the triangular wave generator 31, is 200 MHz; however, the modulation frequency is not limited to this value. For instance, a frequency equivalent to approximately 10 times the bandwidth of the envelope signal can be used as the modulation frequency for pulse width modulation.

Figure 3:
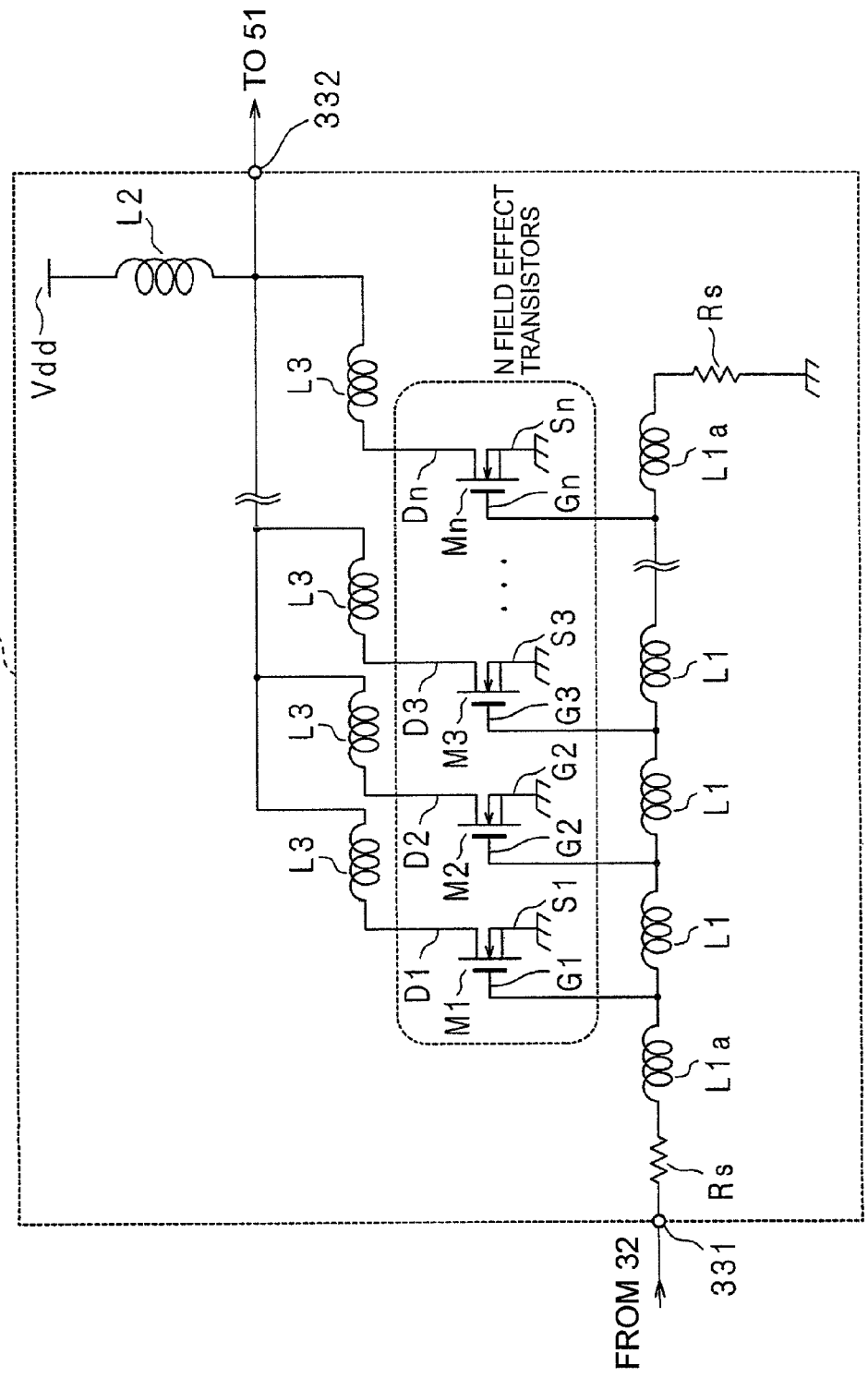
FIG. 3 is a circuit diagram showing a configuration of a switching circuit according to one embodiment.

FIG. 3 is a circuit diagram showing a configuration of the switching circuit 33 according to the embodiment. The switching circuit 33 has a coil L2 having one end thereof connected to a power supply Vdd, and n field effect transistors (MOSFETs, simply referred to as "transistors" hereinafter) M1, M2, . . . , Mn. Coils L3 are interposed between the other end of the coil L2 and drains D1, D2, . . . , Dn (n is an integer of 2 or more), respectively. Sources S1, S2, . . . , Sn of the respective transistors M1, M2, . . . , Mn are connected to a ground potential. The other end of the coil L2 is connected to an output terminal 332 of the switching circuit 33.

Each of n−1 coils L1 is connected between a gate Gk and a gate Gk+1 of respective transistors Mk and Mk+1 (k is an integer from 1 to n−1). The n−1 coils L1 and stray capacitances Cgs (not shown) of the gates G1, G2, . . . , Gn configure a connection circuit. One end and the other end of the connection circuit are connected to an input terminal 331 and the ground potential, respectively, via a series circuit of coils L1a and termination resistors Rs. A capacitor C1, described hereinafter, may be interposed between the termination resistor Rs and the ground potential. An impedance of the termination resistor Rs matches a characteristic impedance of the connection circuit.

In the switching circuit 33 described above, a PWM signal, which is applied from the comparator 32 to the termination resistor Rs via the input terminal 331, is applied to a gate Gm (m is an integer from 1 to n) at a constant time interval while propagating through the connection circuit. This time interval is set to be 1/n of a modulation cycle of pulse width modulation. In other words, a PWM signal having the phase thereof delayed with respect to the gate G1 by $2\pi(m-1)/n$ is applied to the gate Gm. Once the PWM signal is propagated to the gate Gm of a transistor Mm, the transistor Mm is switched between the coil L3 connected to a drain Dm and the ground potential, and the PWM signal that is subjected to polarity inversion and amplification is applied from the drain Dm to the output terminal 332 via the coil L3. Therefore, the signal that is output from the other end of the coil L2, which is the output terminal 332, is a signal that is obtained by adding up, via the respective coils L3, the PWM signals of substantially equal amplitude that are output from the drains D1, D2, ..., Dn respectively.

Next is described a mechanism of adding up the PWM signals that are applied from the drain Dm of the transistor Mm to the output terminal 332, with an example in which n=8.

Figure 4:
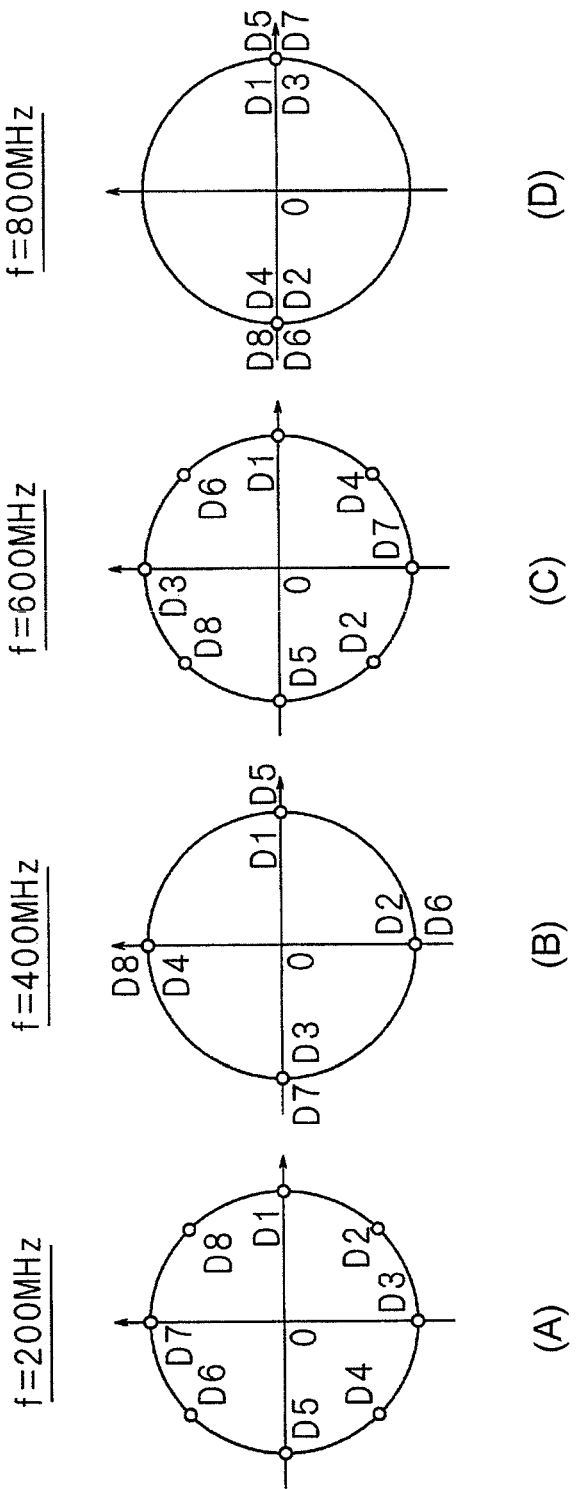
FIG. 4 is a diagram showing signal points on a complex plane which corresponds to amplitudes/phases of signals obtained at drains.

FIG. 4 is a diagram showing signal points on a complex plane which correspond to the amplitudes/phases of the signals obtained at the drains D1, D2, ..., D8. In each of the diagrams, the horizontal axis represents a real axis and a vertical axis represents an imaginary axis. The signal points corresponding to the fundamental waves having the same frequency as the modulation frequency for pulse width modulation (200 MHz in this example) are shown in (A) of FIG. 4. The signal points corresponding to second-order harmonics, third-order harmonics, and fourth-order harmonics are shown in (B), (C), and (D) of FIG. 4, respectively.

When the signal point corresponding to the drain D1 is placed on the real axis as shown in (A) of FIG. 4, the signal points corresponding to the drains D1, D2, ..., D8 are arranged concentrically around the origin because the amplitudes of the signals obtained at the drains D1, D2, ..., D8 are constant. Furthermore, the transistors M1, M2, ..., M8 are switched sequentially at an interval of ⅛ of a modulation cycle (cycle of the fundamental wave) of pulse width modulation, i.e., with a phase difference of $-\pi/4$. Thus, the phase difference between the adjacent signal points corresponding to the drains D1, D2, ..., D8 becomes $-\pi/4$ ($=-2\pi/8$).

Similarly, as shown in (B) of FIG. 4, the transistors M1, M2, ..., M8 are switched sequentially at an interval of ⅔ of a cycle of the second-order harmonic, i.e., with a phase difference of $-\pi/2$. Therefore, the phase difference between the adjacent signal points corresponding to the drains D1, D2, ..., D8 becomes $-\pi/2$ ($=-2\times2\pi/8$). For the third-order harmonic, the phase difference between the adjacent signal points corresponding to the drains D1, D2, ..., D8 becomes $-3\pi/4$ ($=-3\times2\pi/8$), as shown in (C) of FIG. 4. For the fourth-order harmonic, the phase difference between the adjacent signal points corresponding to the drains D1, D2, ..., D8 becomes $-\pi$ ($=-4\times2\pi/8$), as shown in (D) of FIG. 4.

The signal points shown in (A) to (D) of FIG. 4 are symmetry with respect to the origin. Consequently, when the signals of the drains D1, D2, ..., D8 corresponding to all of the signal points shown in (A) to (D) of FIG. 4 are added up evenly, these signals cancel each other out, resulting in having zero amplitude. Because the signal that is output from the output terminal 332 is obtained by evenly adding up the signals that are output from the drains D1, D2, ..., Dn, at least the fundamental waves, second-order harmonics, third-order harmonics, and fourth-order harmonics cancel each other out at the output terminal 332 when n=8.

For fifth-order, sixth-order, and seventh-order harmonics, which are not shown, the phase differences between the adjacent signal points corresponding to the drains D1, D2, ..., D8 become $-5\pi/4$ ($=-5\times2\pi/8$), $-3\pi/2$ ($=-6\times2\pi/8$), and $-7\pi/4$ ($=-7\times2\pi/8$), respectively. In these harmonics as well, when the signals obtained at the drains D1, D2, ..., D8 are added up evenly, the amplitude of the resultant signal becomes zero.

For eighth-order harmonics, on the other hand, the phase difference between the adjacent signal points corresponding to the drains D1, D2, ..., D8 becomes $-2\pi$ ($=-8\times2\pi/8$), and all of the signal points overlap at one point. Therefore, when the signals of the drains D1, D2, ..., D8 are added up evenly, the amplitude of the signal is expected to increase by the number of signals added, without causing the added up signals to cancel each other out.

An induction result of these above-described facts is that the fundamental wave of pulse width modulation and the harmonics of (n−1) and subsequent orders are canceled and output from the output terminal 332 of the switching circuit 33 shown in FIG. 3. In other words, the envelope signal shown in (F) of FIG. 2 is output from the output terminal 332 of the switching circuit 33.

Hereinafter is described how the fundamental wave and the harmonics are canceled depending on the number of transistors of the switching circuit 33, i.e., the number of amplification stages for the PWM signals.

Figure 5:
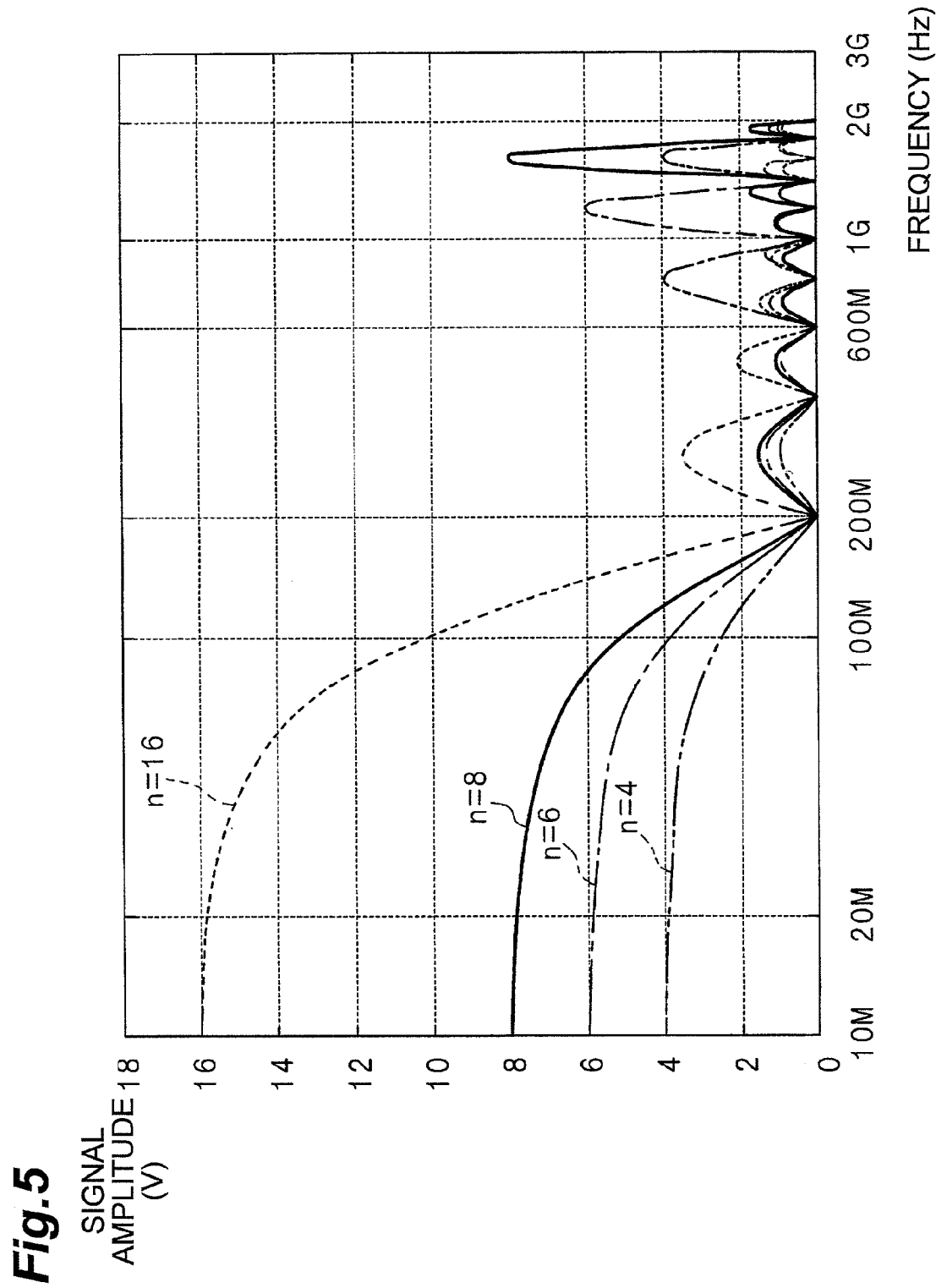
FIG. 5 is a graph showing cancellation characteristics of a fundamental wave and harmonics with respect to the number of amplification stages (n)

FIG. 5 is a graph showing cancellation characteristics of the fundamental wave and harmonics with respect to the number of amplification stages (n). The horizontal axis of FIG. 5 represents frequency (Hz) and the vertical axis represents the amplitudes (V) of the signals obtained at the output terminal 332. The signal amplitudes obtained when n=4, 6, 8, and 16 are shown by a two-dot chain line, a chain line, a solid line, and a broken line, respectively. The characteristics shown in FIG. 5 are obtained as a result of simulation where the transistors M1, M2, ..., Mn are switched by the PWM signals such that a signal amplitude of 1 V is obtained per amplification stage. In a frequency that is sufficiently lower than the fundamental wave of pulse width modulation (200 MHz), the signals that are output from the transistors M1, M2, ..., Mn are added up in substantially the same phase. Therefore, the amplitude (V) of the resultant signal has a value equivalent to the number of amplification stages n.

First, when n=4, the fundamental waves of pulse width modulation, the second-order harmonics, and the third-order harmonics are canceled at the output terminal 332. Consequently, the amplitudes of the harmonic signals at f=200 MHz, 400 MHz, and 600 MHz become zero. Because the fourth-order harmonics are added at the output terminal 332 as described above, a peak is observed in the amplitude of the signal at f=800 MHz (see the two-dot chain line). This type of peak is observed at f=1.6 GHz as well, which is the eighth-order (fourth-order×2) harmonic.

Next, when n=6, the fundamental waves of pulse width modulation and the second-order harmonics to the fifth-order harmonics are canceled at the output terminal 332. Consequently, the amplitudes of the harmonic signals from f=200 MHz to f=1 GHz become zero every 200 MHz. Because the sixth-order harmonics are added at the output terminal 332, a peak is observed in the amplitude of the signal at f=1.2 GHz (see the chain line).

Similarly, when n=8, the fundamental waves of pulse width modulation and the second-order harmonics to the seventh-order harmonics are canceled at the output terminal 332. Consequently, the amplitudes of the signals from f=200 MHz to f=1.4 GHz become zero every 200 MHz. Because the eighth-order harmonics are added at the output terminal 332, a peak is observed in the amplitude of the signal at f=1.6 GHz (see the solid line).

Moreover, when n=16, the fundamental waves of pulse width modulation and the second-order harmonics to the fifteenth-order harmonics are canceled at the output terminal 332. Consequently, the amplitudes of the harmonic signals from f=200 MHz to f=3 GHz become zero, and no peaks are observed in the signal within the frequency range shown in FIG. 5.

Because the harmonics of up to f=1.4 GHz are canceled by setting the number of amplification stages at 8 or more as described above, it is confirmed that substantially practical cancellation characteristics can be obtained.

According to Embodiment 1 described above, the gates of the n transistors are connected to the connection contacts of the n−1 coils of the connection circuit through which the PWM signal propagates and to the input and output terminals of the connection circuit, and the third coils are interposed between the drains of the transistors and the other end of the second coil having one end thereof connected to the Vdd.

Due to this configuration, the transistors are switched sequentially by the PWM signal propagating through the connection circuit, at a time interval that is 1/n the modulation cycle of pulse width modulation. Then, the PWM signals of substantially equal amplitude that are amplified at the transistors are added up at the other end of the second coil. The signal points that correspond to the amplitudes and phases of the signals obtained at the drains of the transistors are arranged on a circle around the origin in a complex plane, at a regular interval with a phase difference of −2kπ/8 (k is an integer from 1 to n−1) with respect to the fundamental wave of pulse width modulation and the harmonics of n−1 and subsequent orders. Therefore, the PWM signals are added up such that the fundamental waves of the PWM signals and the harmonics of n−1 and subsequent orders cancel each other out. In other words, the PWM signals can be added up and the fundamental waves of pulse width modulation and the harmonics can be removed, without using a transmission circuit and filter with a high loss.

As a result, the PWM signals amplified in the plurality of switching elements can be synthesized with low loss, and the envelope signal, which is the modulation signal, can be demodulated.

When the signal amplitudes and phases of the Mth harmonics of the PWM signals obtained at the drains of the transistors are associated with the signal points on each complex plane, the phase difference between the signal points, (−2Mπ/n), becomes M times the phase difference (−2π/n) between the signal points with respect to the fundamental wave. In other words, all of the signal points overlap at one point first when the harmonics are the nth-order harmonics (M=n).

Therefore, when n is 8 or more, for at least the second-order harmonic to the seventh-order harmonic, the signal points on the complex plane which correspond to the drains of the transistors do not overlap at one point, and practical cancellation characteristics can be therefore obtained.

The comparator generates the PWM signal, the pulse widths of which are modulated in accordance with an envelope signal that is input to the EER amplifier as a modulation signal. Then, the PWM signals are demodulated into an envelope signal by switching the transistors using the PWM signal and synthesizing the PWM signals.

In this manner, the switching circuit, which can not only synthesize, with low loss, the PWM signals amplified at the plurality transistors, but also demodulate a modulation signal, can be applied to the envelope signal amplifier.

Embodiment 2

Embodiment 1 does not exclude an option of configuring the switching circuit 33 with discrete parts on a circuit board. In Embodiment 2, on the other hand, a switching circuit is formed on a semiconductor substrate, as an IC.

Figure 6:
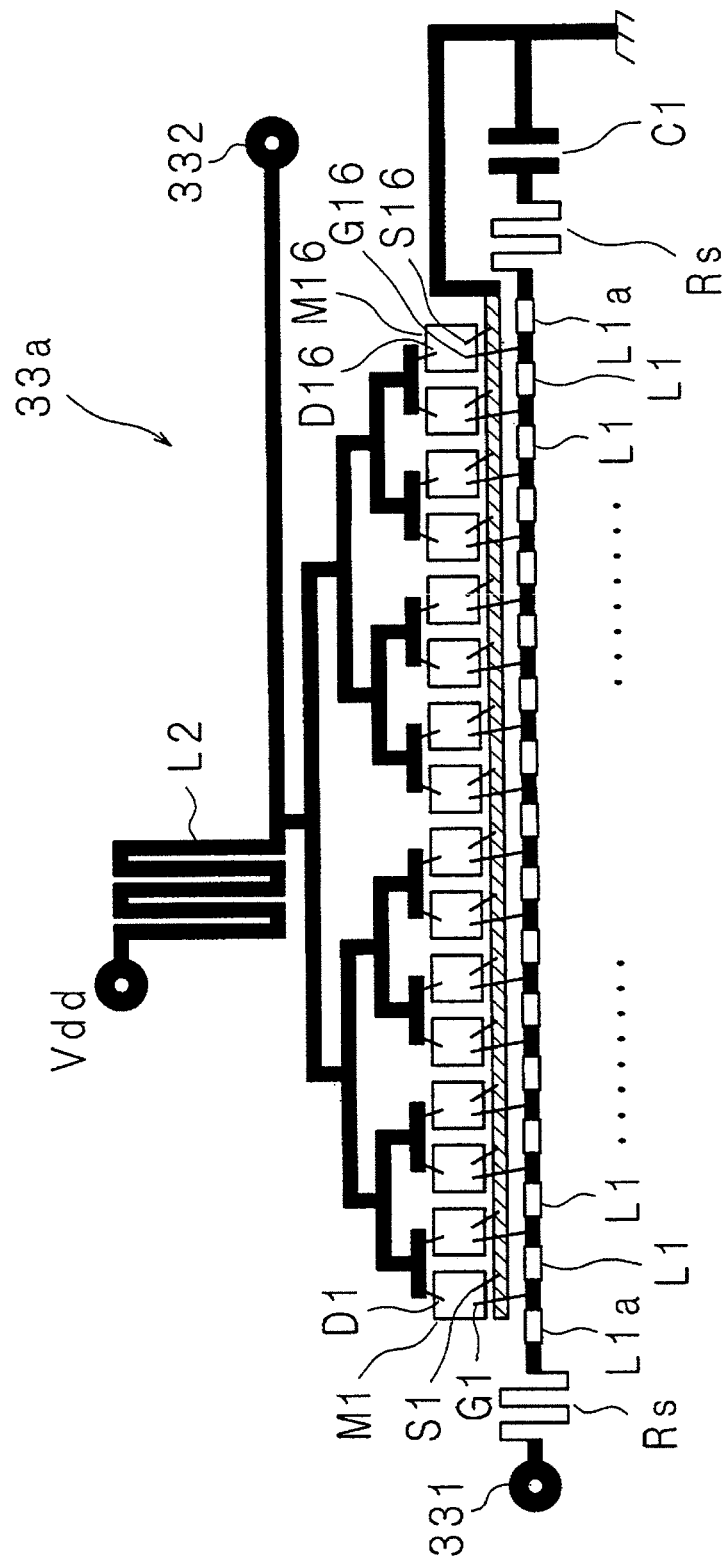
FIG. 6 is a schematic plan view of a switching circuit according to another embodiment.

FIG. 6 is a schematic plan view of a switching circuit 33a according to another embodiment (Embodiment 2). The switching circuit 33a is formed on a semiconductor substrate of a monolithic integrated circuit. The switching circuit 33a has the coil L2 having one end connected to the power supply Vdd, and sixteen transistors M1 to M16. The other end of the coil L2 is connected to drains D1 to D16 by conductor patterns (connecting members). Sources S1 to S16 of the respective transistors M1 to M16 are connected to a ground potential (the ground potential is partially marked with diagonal lines in FIG. 6). The other end of the coil L2 is configured as the output terminal 332 of the switching circuit 33a.

Gates G1 to G16 of the respective transistors M1 to M16 are connected to either end of fifteen coils L1, which are connected in series, and connecting contacts between the coils L1. The fifteen coils L1 and stray capacitances Cgs (not shown) of the gates G1 to G16 configure a connection circuit. One end and the other end of the connection circuit are connected to the input terminal 331 and one end of the capacitor C1, respectively, via a series circuit of the coils L1a and the termination resistors Rs. The other end of the capacitor C1 is connected to the ground potential. The capacitor C1 functions to cut DC bias voltage applied to the gates G1 to G16.

The coil L2, fifteen coils L1, coils L1a, termination resistors Rs, and capacitor C1, are formed by the conductor patterns. The conductor patterns (connecting members) that connect the other end of the coil L2 with the drains D1 to D16 have parasitic inductances and can be replaced with the coils L3 of the switching circuit 33 according to Embodiment 1. In other words, the conductor patterns (connecting members) configure the third inductance elements. The coils L3 can be actually replaced by the parasitic inductances of the conductor patterns and an inductance of a wiring between a semiconductor chip of each of the transistors M1 to M16 and each of the drains D1 to D16.

In the configuration described above, while the PWM signal provided from the input terminal 331 to the termination resistor Rs propagates through the connection circuit having the fifteen coils L1, the transistors M1 to M16 are switched sequentially. This configuration is same as that of the switching circuit 33 of Embodiment 1 in that the PWM signals are amplified at the transistors M1 to M16, output from the drains D1 to D16, and added up at the coil L2, whereby the fundamental waves of pulse width modulation and the harmonics are canceled in the output terminal 332.

Because the switching circuit 33a is formed on the monolithic integrated circuit, the entire circuit is made small and has harmonic characteristics that are more favorable than those of a circuit that is configured on a circuit board made of insulating base material by using discrete parts.

The same reference numerals are applied to the sections corresponding to those described in Embodiment 1; thus, descriptions thereof are omitted.

According to Embodiment 2 described above, in addition to the third coils to be imposed between the drains of the transistors and the other end of the second coil, the connecting members are interposed therebetween. Consequently, the parasitic inductances of the connecting members can play the roles of the third coils.

Because the switching circuit is formed on the semiconductor substrate of the monolithic integrated circuit, the switching circuit can be made small and improve the harmonic characteristics for an amplifier.

Embodiment 3

In Embodiment 2 the vertical MOSFETs are provided on a semiconductor substrate. In Embodiment 3, on the other hand, high-withstand voltage/high-power vertical MOSFETs are provided on the same semiconductor substrate.

FIG. 7 is a schematic plan view of a switching circuit 33b according to yet another embodiment (Embodiment 3). In (A) and (B) of FIG. 7, plan views illustrating front and rear surfaces of the switching circuit 33b are shown, respectively. The switching circuit 33b is formed on a semiconductor substrate of a monolithic integrated circuit and has transistors M1, M2, . . . , M8 of vertical MOSFETs that are disposed in a circular pattern. Sources S1 to S8 and gates G1 to G8 of the transistors M1, M2, . . . , M8 are formed on the front surface of the semiconductor substrate, whereas drains D1, D2, . . . , D8 of the respective transistors M1, M2, . . . , M8 are formed on the rear surface of the semiconductor substrate.

Sources S1 to S16 of transistors M1 to M16 are connected to circular conductor patterns connected to the ground potential. Gates G1 to G8 of the respective transistors M1 to M8 are connected to either end of a circuit in which seven coils L1 are connected in series and connecting points between the coils L1. In this series circuit, the coils L1 are disposed in a circular pattern. The seven coils L1 and stray capacitances Cgs (not shown) of the gates G1 to G8 configure a connection circuit. One end and the other end of the connection circuit are connected to the input terminal 331 and one end of the capacitor C1, respectively, via the series circuit of the coils L1a and the termination resistors Rs. The other end of the capacitor C1 is connected to the ground potential.

The switching circuit 33b also has the coil L2 on the rear surface of the semiconductor substrate. One end of the coil L2 is connected to the power supply Vdd. The other end of the coil L2 is connected to a node N1 that is positioned equidistant from the drains D1, D2, . . . , D8. Conductor patterns (connecting members) extending from the drains D1, D2, . . . , D8 of the respective transistors M1, M2, . . . , M8 are connected to the node N1. These conductor patterns (connecting members) have substantially the same length. The other end of the coil L2 is configured as the output terminal 332 of the switching circuit 33b. The conductor patterns (connecting members) described above have parasitic inductances and can be replaced with the coils L3 of the switching circuit 33 of Embodiment 1. In other words, the conductor patterns (connecting members) configure the third inductance elements.

In the configuration described above, while the PWM signal provided from the input terminal 331 to the termination resistor Rs propagates through the connection circuit having the seven coils L1, the transistors M1, M2, . . . , M8 are switched sequentially. This configuration is same as that of the switching circuit 33 of Embodiment 1 in that the PWM signals are amplified at the transistors M1, M2, . . . , M8, output from the drains D1 to D8, and added up at the coil L2, whereby the fundamental wave of pulse width modulation and the harmonics are canceled in the output terminal 332.

In the switching circuit 33b, forming the sources S1 to S8 and the gates G1 to G8 on the front surface of the monolithic integrated circuit and the drains D1 to D8 on the rear surface thereof, can increase the freedom of the wiring. When the transistors M1, M2, . . . , M8 are disposed in a circular pattern as shown in FIG. 7, the length of conductor patterns (wiring members) that connect the drains D1, D2, . . . , D8 with a specific one point becomes even, and consequently the parasitic inductances become homogenized, which allows the PWM signals output from the drains D1, D2, . . . , D8 to be added up in a balanced manner.

The same reference numerals are applied to the sections corresponding to those described in Embodiments 1 and 2; thus descriptions thereof are omitted.

According to Embodiment 3 described above, configuring each of the transistors by a vertical MOSFET can not only enhance the withstand voltage and power of the switching circuit, but also reduce an on-resistance thereof and hence loss.

Furthermore, because the drain electrodes and the source electrodes are formed on one side of the monolithic integrated circuit and the gate electrodes are formed on the other side, the lengths of the wiring extending from the drain electrodes of the transistors to the other end of the second coil can be made uniform. As a result, the PWM signals amplified at the respective transistors can be added up in a balanced manner at the other end of the second coil.

REFERENCE SIGNS LIST

2: Wave detector, 3: Envelope signal amplifier, 33, 33a, 33b: Switching circuit, L1: Coil (first inductance element), L2: Coil (second inductance element), L3: Coil (third inductance element), Rs: Termination resistor, M1, M2, . . . , Mn: Field effect transistor (MOSFET), D1, D2, . . . , Dn: Drain (one end of switching element), G1, G2, . . . , Gn: Gate (control terminal of switching element), Vdd: Power supply (DC power supply)

The invention claimed is:
1. A switching circuit, comprising:
N switching elements having respective one ends and respective control terminals, where N is an integer of 2 or more;
a connection circuit including N−1 first inductance elements connected in series, wherein the control terminals are connected to a plurality of nodes of the connection circuit, respectively, and the nodes include contacts of the first inductance elements and input and output terminals of the connection circuit;
a second inductance element having one end and an other end, the one end of the second inductance element being connected to a DC power supply; and
third inductance elements connected between the other end of the second inductance element and the one ends of the switching elements, respectively,
wherein the switching elements are switched sequentially by a PWM signal that is input to the input terminal of the connection circuit.
2. The switching circuit according to claim 1, wherein N is an integer of 8 or more.
3. The switching circuit according to claim 1, wherein the switching elements and the first, second, and third inductance elements are formed on a semiconductor substrate of a monolithic integrated circuit.
4. The switching circuit according to claim 1, wherein each of the switching elements is a vertical MOSFET.
5. An envelope signal amplifier, comprising:
a modulation circuit for performing pulse width modulation on an analog signal; and
the switching circuit according to claim 1,
wherein the switching circuit is switched by a PWM signal that is obtained as a result of pulse width modulation performed by the modulation circuit on an envelope signal of an input modulation signal.

* * * * *